(12) United States Patent
Lee

(10) Patent No.: US 12,027,125 B2
(45) Date of Patent: Jul. 2, 2024

(54) DISPLAY DEVICE

(71) Applicant: LG DISPLAY CO., LTD., Seoul (KR)

(72) Inventor: TaeKeun Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/983,794

(22) Filed: Nov. 9, 2022

(65) Prior Publication Data

US 2023/0215374 A1    Jul. 6, 2023

(30) Foreign Application Priority Data

Dec. 30, 2021 (KR) .................. 10-2021-0192848

(51) Int. Cl.
   *G09G 3/3266* (2016.01)
(52) U.S. Cl.
   CPC ... *G09G 3/3266* (2013.01); *G09G 2300/0426* (2013.01); *G09G 2310/0291* (2013.01); *G09G 2310/08* (2013.01); *G09G 2330/021* (2013.01)
(58) Field of Classification Search
   CPC ......... G09G 3/3266; G09G 2300/0413; G09G 2310/0267; G09G 2310/0286
   See application file for complete search history.

(56) References Cited

U.S. PATENT DOCUMENTS

| | | | | |
|---|---|---|---|---|
| 2008/0002803 A1* | 1/2008 | Kim | ............... | G09G 3/3674 377/64 |
| 2011/0304604 A1* | 12/2011 | Jo | ............... | G09G 3/3677 345/212 |
| 2013/0169609 A1* | 7/2013 | Son | ............... | G11C 19/287 345/209 |
| 2014/0028534 A1* | 1/2014 | Park | ............... | G09G 3/20 345/84 |
| 2014/0340380 A1* | 11/2014 | Song | ............... | G09G 3/3266 345/212 |
| 2015/0348466 A1* | 12/2015 | Park | ............... | G09G 3/3233 345/82 |
| 2016/0224175 A1* | 8/2016 | Moon | ............... | G06F 3/0412 |
| 2016/0321983 A1* | 11/2016 | Kim | ............... | H10K 59/131 |
| 2017/0047018 A1* | 2/2017 | Park | ............... | G09G 3/3266 |
| 2017/0116923 A1* | 4/2017 | Bae | ............... | G09G 3/3266 |
| 2019/0229174 A1* | 7/2019 | Choi | ............... | H10K 59/1315 |
| 2020/0212132 A1* | 7/2020 | Kim | ............... | G09G 3/32 |
| 2020/0333391 A1* | 10/2020 | Park | ............... | G09G 3/3266 |
| 2023/0186849 A1* | 6/2023 | Chai | ............... | G09G 3/3677 345/204 |
| 2023/0197011 A1* | 6/2023 | Hong | ............... | G09G 3/3283 345/212 |
| 2023/0215374 A1* | 7/2023 | Lee | ............... | G09G 3/3266 345/691 |
| 2023/0215378 A1* | 7/2023 | Choi | ............... | G09G 3/3266 345/204 |

* cited by examiner

*Primary Examiner* — Van N Chow
(74) *Attorney, Agent, or Firm* — POLSINELLI PC

(57) ABSTRACT

A display device according to one aspect of the present disclosure includes: a substrate including a display area and a non-display area enclosing the display area; a plurality of pixels disposed in the display area; and a gate driving unit disposed in the non-display area on both sides of the display area and including a plurality of stages. The plurality of stages includes a plurality of normal output stages and a plurality of dummy stages which does not output a signal. The plurality of dummy stages may be connected to a gate low voltage line.

20 Claims, 9 Drawing Sheets

DISPLAY DEVICE

CROSS-REFERENCE TO RELATED APPLICATION

This application claims the priority of Korean Patent Application No. 10-2021-0192848 filed on Dec. 30, 2021, in the Korean Intellectual Property Office, the disclosure of which is incorporated herein by reference.

BACKGROUND

Field of the Disclosure

The present disclosure relates to a display device, and more particularly, to a display device which has round corner areas and can suppress an abnormal output.

Description of the Background

In the age of information technology, the field of display devices for visually displaying information through electrical signals has grown rapidly. Thus, studies for developing technologies, such as thinning, weight lightening and low power consumption, of various display devices have continued.

Representative examples of the display devices may include a Liquid Crystal Display (LCD) device, a Field Emission Display (FED) device, an Electro-Wetting Display (EWD) device, an Organic Light Emitting Display (OLED) device, and the like.

Of these example display devices, electro-luminescent display devices including the OLED device are self-light emitting display devices and do not require a separate light source as other display devices such as LCD display devices do. Thus, the electro-luminescent display devices can be manufactured as lightweight and thin structures. Further, the electro-luminescent display devices are advantageous in terms of power consumption since they are driven with a low voltage. Also, the electro-luminescent display devices have excellent color expression ability, a high response speed, a wide viewing angle and a high contrast ratio (CR). Therefore, the electro-luminescent display devices are expected to be wildly utilized in various fields.

SUMMARY

Various aspects of the present disclosure provide a display device which has round corner areas and can suppress an abnormal output.

While specific examples may be described below, the present disclosure is not limited to such examples, and may encompass various other alternatives and embodiments that can be clearly understood by those skilled in the art from the following descriptions.

According to an aspect of the present disclosure, the display device includes a substrate that has a display area and a non-display area enclosing the display area. The display device further includes a plurality of pixels disposed in the display area, a gate driving unit disposed in the non-display area on both sides of the display area and including a plurality of stages. The plurality of stages includes a plurality of normal output stages and a plurality of dummy stages. The plurality of dummy stages do not output a signal. The plurality of dummy stages may be connected to a gate low voltage line.

According to the present disclosure, a display device has round corner areas. Since all nodes of a circuit of a dummy stage disposed in a corner area are connected to a gate low voltage line, the introduction of minus (−) charges from the outside is blocked. Therefore, it is possible to suppress an abnormal output of the display device caused by the minus (−) charges.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
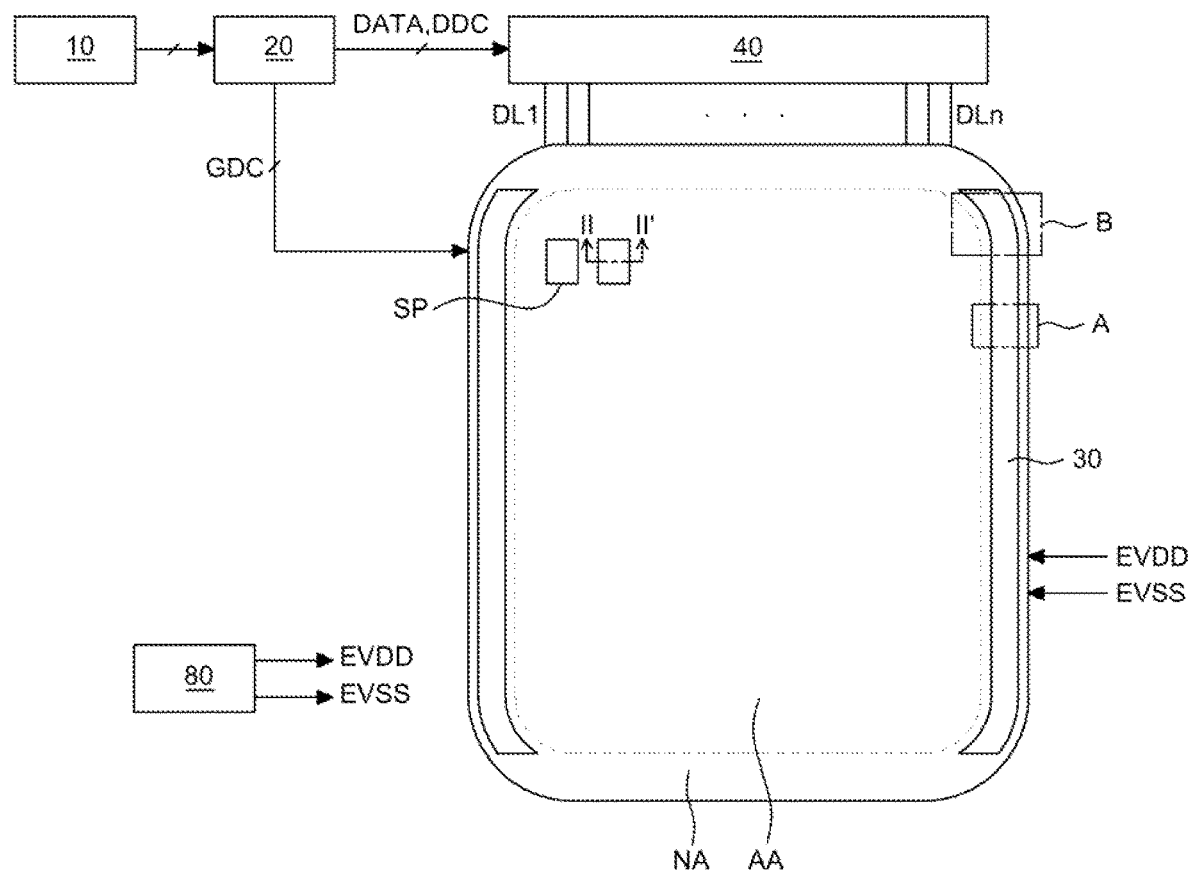
FIG. 1 is a block diagram schematically illustrating a display device according to some aspects of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification unless specified otherwise.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a block diagram schematically illustrating a display device according to some aspects of the present disclosure.

Referring to FIG. 1, a display device 100 includes an image supply unit 10, a timing controller 20, a gate driving unit 30, a data driving unit 40, a display panel 50 and a power supply unit 80.

The image supply unit 10 can output an image data signal supplied from the outside or an image data signal stored in an inner memory together with various driving signals to the timing controller 20. The image supply unit 10 may supply the data signals and various driving signals to the timing controller 20.

The timing controller 20 may output a gate timing control signal GDC for controlling an operation timing of the gate driving unit (gate driver) 30 and a data timing control signal DDC for controlling an operation timing of the data driving unit 40. The timing controller 20 may also output various driving signals (for example, a vertical synchronization signal Vsync and a horizontal synchronization signal Hsync).

Further, the timing controller 20 may supply the data driving unit 40 with a data signal DATA from the image supply unit 10, together with the data timing control signal DDC. For example, the timing controller 20 may be formed into an integrated circuit (IC) form and mounted on a printed circuit board, but is not limited thereto.

The gate driving unit 30 includes a scan driver and an emission driver that output a scan signal (or a scan voltage) and an emission control signal, in response to the gate timing control signal GDC supplied from the timing controller 20. Specifically, the gate driving unit 30 generates and outputs a clock signal, a start signal or the like based on signals output from the timing controller 20 and operates the scan driver and the emission driver based on these signals. Thus, the scan driver and the emission driver output scan signals and emission control signals that can turn on or off a transistor disposed in the display panel 50.

The gate driving unit 30 may supply a scan signal to sub-pixels SP included in the display panel 50 through gate lines.

Also, the gate driving unit 30 may output an emission control signal to emission control lines to control emission control transistors included in each of the sub-pixels SP.

The scan signal has a turn-on level and the emission control signal has a turn-off level during a period for addressing a data voltage Vdata. Then, the scan signal has a turn-off level and the emission control signal has a turn-on level during an emission period of each pixel.

The gate driving unit 30 is formed directly on the display panel 50 as a gate in panel (GIP) type.

The data driving unit 40 can sample and latch the data signal DATA in response to the data timing control signal DDC supplied from the timing controller 20. Also, the data driving unit 40 can convert a digital data signal into an analog data voltage based on a gamma reference voltage and then outputs the analog data voltage.

The data driving unit 40 can supply a data voltage to the sub-pixels SP included in the display panel 50 through data lines DL. The data driving unit 40 may be formed into an IC form and mounted on a printed circuit board, but is not limited thereto.

Meanwhile, the timing controller 20, the gate driving unit 30 and the data driving unit 40 may be separately configured or may be integrated into one IC depending on implementation of the display device 100, but are not limited thereto.

The power supply unit 80 can generate and output high-potential first panel power voltage EVDD and low-potential second panel power voltage EVSS based on an external input voltage supplied from the outside. The power supply unit 80 may generate and output a voltage (e.g., a scan high voltage and a scan low voltage) required for driving the gate driving unit 30 or a voltage (e.g., a drain voltage and a half drain voltage) required for driving the data driving unit 40 in addition to the first panel power voltage EVDD and the second panel power voltage EVSS.

The display panel 50 can display an image in response to a driving signal including the scan signal and the data voltage output from the driving unit including the gate driving unit 30 and the data driving unit 40, and the first panel power voltage EVDD and the second panel power voltage EVSS output from the power supply unit 80.

The display panel 50 includes a display area AA and a non-display area NA.

The display panel 50 includes a substrate made of glass or plastic, and a plurality of gate lines and a plurality of data lines crossing each other on the substrate. A plurality of pixels PX is defined at intersections of the plurality of gate lines and the plurality of data lines. An area in which the plurality of pixels PX displaying an image is disposed may be referred to as the display area AA. Also, an area which is disposed outside the display area AA and in which the plurality of pixels PX is not disposed may be referred to as the non-display area NA.

The display area AA is an area which displays an image and in which a plurality of pixels is disposed. In the display area AA, a display element for displaying an image and a driving unit for driving the display element may be disposed. For example, if the display device 100 is an OLED device, the display device 100 may be an organic light emitting element including an anode, an organic layer and a cathode. The driving unit may be composed of various components such as a power line, a gate line, a data line, a transistor and a storage capacitor for driving the organic light emitting element. Hereinafter, for the convenience of description, the display device 100 will be assumed as an OLED device. However, the display device 100 is not limited to the OLED device.

Referring to FIG. 1, the display panel 50 may have a free-form corner area, and the display area AA may have a shape corresponding to the free-form corner area of the display panel 50. The display panel 50 and the display area AA may have round corners, but are not limited thereto. The display panel 50 and the display area AA may have various shapes appropriate for a design of an electronic device equipped with the display device 100.

The non-display area NA is an area which does not display an image and in which various lines and circuits for driving the display element in the display area AA are disposed. For example, the non-display area NA may be defined as an area enclosing the display area AA, but is not limited thereto. The non-display area NA may be defined as an area extending from the display area AA. The non-display area NA may also be defined as extending from a plurality of sides of the display area AA.

A Chip on Flex (COF) or a Flexible Printed Circuit Board (FPCB) on which various ICs, such as a gate driver IC and a data driver IC, and driving circuits are disposed may be disposed in the non-display area NA. Also, a driving circuit referred to as a Gate in Panel (GIP) may be disposed in the non-display area NA.

The plurality of pixels PX of the display panel 50 will be described in more detail with reference to FIG. 2.

Figure 2:
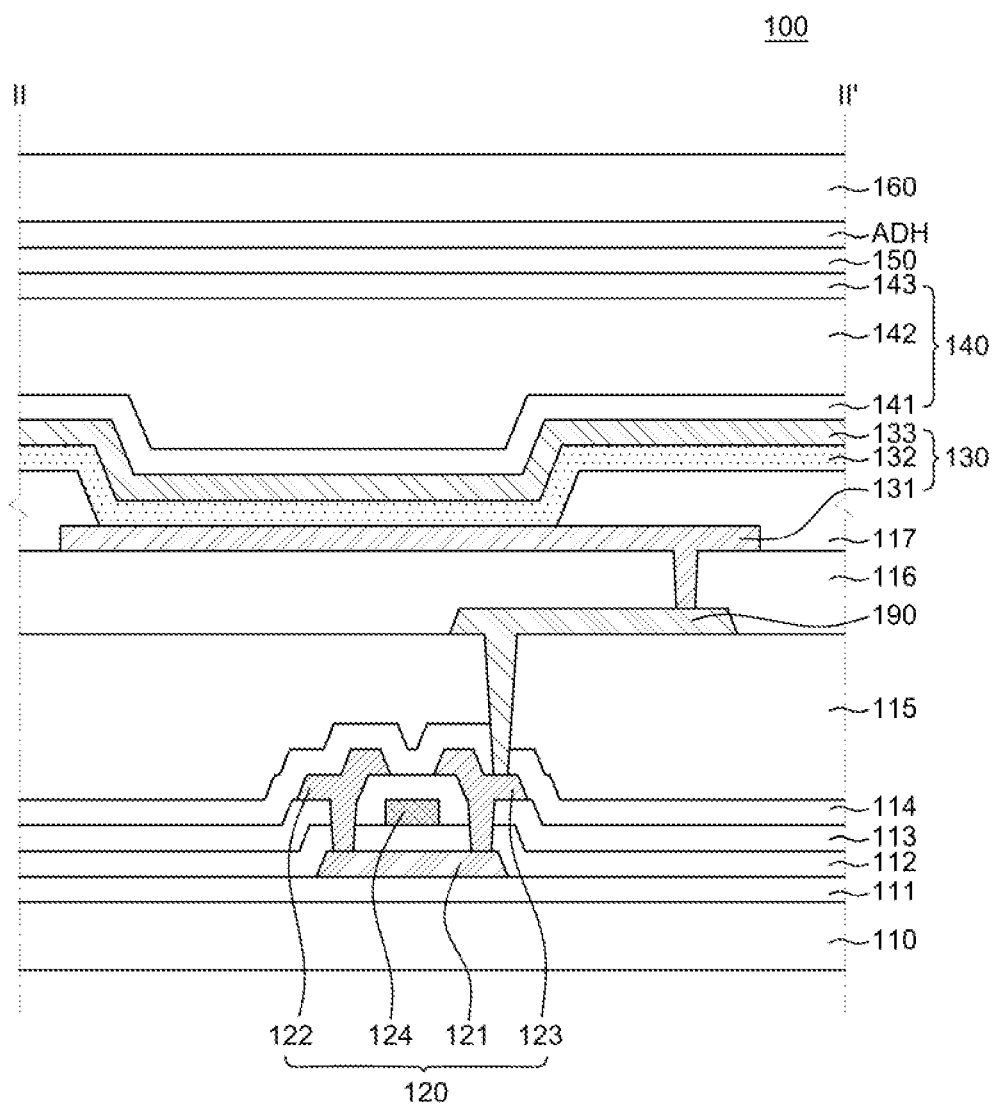
FIG. 2 is a cross-sectional view taken along a line II-IF of FIG. 1 according to some aspects of the present disclosure.

FIG. 2 is a cross-sectional view taken along the line II-IF of FIG. 1 according to some aspects of the present disclosure. Specifically, FIG. 2 is a cross-sectional view illustrating a pixel PX in the display area AA of the display device 100 according to some aspects of the present disclosure.

Referring to FIG. 2, the display device 100 according to an exemplary embodiment of the present disclosure may be a top emission type display device. The display device 100 may include a substrate 110, a buffer layer 111, a transistor 120, a gate insulating layer 112, an interlayer insulating layer 113, a passivation layer 114, a first planarization layer 115, a connection electrode 190, a second planarization layer 116, a bank 117, an emission element 130, an encapsulation unit 140, a polarizing plate 150 and a cover glass 160.

The substrate 110 may support various components of the display device 100. The substrate 110 may be made of glass or a plastic material having flexibility. If the substrate 110 is made of a plastic material, it may be made of, for example, polyimide (PI).

The buffer layer 111 may be disposed on the substrate 110. The buffer layer 111 may be formed as a single layer or a multilayer of silicon nitride (SiNx) or silicon oxide (SiOx). The buffer layer 111 enhances adhesion between the layers formed on the buffer layer 111 and the substrate 110 and blocks alkali elements discharged from the substrate 110.

The transistor 120 may be disposed on the buffer layer 111. The transistor 120 may include an active layer 121, a gate electrode 124, a source electrode 122 and a drain electrode 123. Herein, the source electrode 122 may be a drain electrode 123 and the drain electrode 123 may be a source electrode 122 depending on a design of a pixel circuit. The active layer 121 of the transistor 120 may be disposed on the buffer layer 111.

The active layer 121 may be made of various materials such as polysilicon, amorphous silicon or an oxide semiconductor. The active layer 121 may include a channel region in which a channel is formed when the transistor 120 is driven, and a source region and a drain region on both sides of the channel region. The source region is a portion of the active layer 121 connected to the source electrode 122, and the drain region is a portion of the active layer 121 connected to the drain electrode 123.

The gate insulating layer 112 may be disposed on the active layer 121 of the transistor 120. The gate insulating layer 112 may be formed as a single layer or a multilayer of silicon nitride (SiNx) or silicon oxide (SiOx). Contact holes through which the source electrode 122 and the drain electrode 123 of the transistor 120 are respectively connected to the source region and the drain region in the active layer 121 of the transistor 120 may be formed in the gate insulating layer 112.

The gate electrode 124 of the transistor 120 may be disposed on the gate insulating layer 112. The gate electrode 124 may be formed as a single layer or a multilayer of any one of molybdenum (Mo), copper (Cu), titanium (Ti), aluminum (Al), chromium (Cr), gold (Au), nickel (Ni) and neodymium (Nd), or an alloy thereof. The gate electrode 124 may be formed on the gate insulating layer 112 so as to overlap the channel region in the active layer 121 of the transistor 120.

The interlayer insulating layer 113 may be disposed on the gate insulating layer 112 and the gate electrode 124. The interlayer insulating layer 113 may be formed as a single layer or a multilayer of silicon nitride (SiNx) or silicon oxide (SiOx). Contact holes through which the source region and the drain region in the active layer 121 of the transistor 120 are exposed may be formed in the interlayer insulating layer 113.

The source electrode 122 and the drain electrode 123 of the transistor 120 may be disposed on the interlayer insulating layer 113.

The source electrode 122 and the drain electrode 123 of the transistor 120 may be connected to the active layer 121 of the transistor 120 through the contract holes formed in the gate insulating layer 112 and the interlayer insulating layer 113. Therefore, the source electrode 122 of the transistor 120 may be connected to the source region in the active layer 121 through the contact holes formed in the gate insulating layer 112 and the interlayer insulating layer 113. Also, the drain electrode 123 of the transistor 120 may be connected to the drain region in the active layer 121 through the contact holes formed in the gate insulating layer 112 and the interlayer insulating layer 113.

The source electrode 122 and the drain electrode 123 of the transistor 120 may be formed by the same process. Also, the source electrode 122 and the drain electrode 123 of the transistor 120 may be made of the same material. The source electrode 122 and the drain electrode 123 of the transistor 120 may be formed as a single layer or a multilayer of any one of molybdenum (Mo), copper (Cu), titanium (Ti), aluminum (Al), chromium (Cr), gold (Au), nickel (Ni) and neodymium (Nd), or an alloy thereof.

The passivation layer 114 for protecting the source electrode 122 and the drain electrode 123 may be disposed on the source electrode 122 and the drain electrode 123. The passivation layer 114 is an insulating layer for protecting the components under the passivation layer 114. For examples, the passivation layer 114 may be formed as a single layer or a multilayer of silicon nitride (SiNx) or silicon oxide (SiOx), but is not limited thereto. The passivation layer 114 may be omitted in some embodiments.

The first planarization layer 115 may be disposed on the transistor 120 and the passivation layer 114. As shown in FIG. 3, a contact hole through which the drain electrode 123 is exposed may be formed in the first planarization layer 115. The first planarization layer 115 may be an organic material layer for planarization an upper portion of the transistor 120. The first planarization layer 115 may be made of an organic material such as acryl resin, epoxy resin, phenolic resin, polyamide resin or polyimide resin, but is not limited thereto. The first planarization layer 115 may be an inorganic material layer for protecting the transistor 120. The first planarization layer 115 may be made of an inorganic material such as silicon nitride (SiNx) or silicon oxide (SiOx). The first planarization layer 115 may be formed as a single layer or a multilayer of silicon nitride (SiNx) or silicon oxide (SiOx).

The connection electrode 190 may be disposed on the first planarization layer 115. Also, the connection electrode 190 may be connected to the drain electrode 123 of the transistor 120 through the contact hole formed in the first planarization layer 115. The connection electrode 190 may serve to electrically connect the transistor 120 and the emission element 130. For example, the connection electrode 190 may serve to electrically connect the drain electrode 123 of the transistor 120 and a first electrode 131 of the emission element 130. The connection electrode 190 may be formed as a single layer or a multilayer of any one of molybdenum (Mo), copper (Cu), titanium (Ti), aluminum (Al), chromium (Cr), gold (Au), nickel (Ni) and neodymium (Nd), or an alloy thereof. The connection electrode 190 may be made of the same material as the source electrode 122 and the drain electrode 123 of the transistor 120.

The second planarization layer 116 may be disposed on the connection electrode 190 and the first planarization layer 115. Also, as shown in FIG. 3, a contact hole through which the connection electrode 190 is exposed may be formed in the second planarization layer 116. The second planarization layer 116 may be an organic material layer for planarization an upper portion of the transistor 120. The second planarization layer 116 may be made of an organic material such as acryl resin, epoxy resin, phenolic resin, polyamide resin or polyimide resin.

In each of the plurality of pixels, the emission element 130 may be disposed on the second planarization layer 116. The emission element 130 may include the first electrode 131 as an anode, an emission structure 132 and a second electrode 133 as a cathode. The first electrode 131 of the emission element 130 may be disposed on the second planarization layer 116. The first electrode 131 may be electrically connected to the connection electrode 190 through the contact hole formed in the second planarization layer 116. Since the first electrode 131 of the emission element 130 is connected to the connection electrode 190 through the contact hole formed in the second planarization layer 116, the first electrode 131 can be electrically connected to the transistor 120.

The first electrode 131 as an anode may be formed into a multilayered structure including a transparent conductive film and an opaque conductive film having a high reflection efficiency. The transparent conductive film may be made of a material having a relatively high work function, such as indium-tin-oxide ITO or indium-zinc-oxide IZO. The opaque conductive film may be formed as a single or multilayered structure including aluminum (Al), silver (Ag), copper (Cu), lead (Pb), molybdenum (Mo), titanium (Ti), or an alloy thereof. For example, the first electrode 131 may be formed into a structure in which a transparent conductive film, an opaque conductive film and a transparent conductive film are sequentially laminated, but is not limited thereto. The first electrode 131 may be formed into a structure in which a transparent conductive film and an opaque conductive film are sequentially laminated.

The bank 117 may be disposed on the first electrode 131 and the second planarization layer 116. An opening through which the first electrode 131 is exposed may be formed in the bank 117. The bank 117 may define an emission area of the emission element 130 and thus may also be referred to as a pixel definition layer.

The emission structure 132 including an emission layer may be disposed on the first electrode 131.

The emission structure 132 of the emission element 130 may be formed on the first electrode 131 by laminating a hole layer, an emission layer, and an electron layer one above another in this order or in the reverse order. Also, the emission structure 132 may include a first and second emission structures facing each other with a charge generation layer therebetween. In this case, an emission layer of any one of the first and second emission structures generates blue light, and an emission layer of the other of the first and second emission structures generates yellow-green light. Thus, white light can be generated through the first and second emission structures. The white light generated from the emission structure 132 may be incident into a color filter located on the emission structure 132, and, thus, a color image may be implemented. Alternatively, each emission structure 132 may generate a light of a particular color corresponding to each sub-pixel without a separate color filter to implement a color image. For example, the emission structure 132 of a red sub-pixel may generate red light, the emission structure 132 of a green sub-pixel may generate green light, and the emission structure 132 of a blue sub-pixel may generate blue light.

The second electrode 133 as a cathode may be further disposed on the emission structure 132. Since the display device 100 is a top emission type display device, the second electrode 133 may be made of a metal material having a very thin thickness or made of a transparent conductive material. The second electrode 133 of the emission element 130 may be disposed on the emission structure 132 so as to face the first electrode 131 with the emission structure 132 therebetween. In the display device 100 according to an exemplary embodiment of the present disclosure, the second electrode 133 may be a cathode electrode. The encapsulation unit 140 which suppresses the permeation of moisture may be further disposed on the second electrode 133.

The encapsulation unit 140 may include a first inorganic encapsulation layer 141, an organic encapsulation layer 142 and a second inorganic encapsulation layer 143. The first inorganic encapsulation layer 141 of the encapsulation unit 140 may be disposed on the second electrode 133. Further, the organic encapsulation layer 142 may be disposed on the first inorganic encapsulation layer 141. Furthermore, the second inorganic encapsulation layer 143 may be disposed on the organic encapsulation layer 142. The first inorganic encapsulation layer 141 and the second inorganic encapsulation layer 143 of the encapsulation unit 140 may be made of an inorganic material such as silicon nitride (SiNx) or silicon oxide (SiOx). The organic encapsulation layer 142 of the encapsulation unit 140 may be made of an organic material such as acryl resin, epoxy resin, phenolic resin, polyamide resin or polyimide resin.

The polarizing plate 150 may be disposed on the encapsulation unit 140. The polarizing plate 150 suppresses reflection of external light on the display area AA of the substrate 110. When the display device 100 is used outdoors, external natural light enters the device and is reflected by a reflection layer included in the first electrode 131 of the emission element 130 or reflected by an electrode, which is made of a metal and disposed below the emission element 130. Therefore, an image of the display device 100 may not be visibly recognized by the light reflected as described above. The polarizing plate 150 polarizes light entering from the outside to a specific direction and suppresses the emission of the reflected light to the outside of the display device 100.

The cover glass 160 may be bonded onto the polarizing plate 150 by an adhesive layer ADH. The adhesive layer ADH may serve to bond various components of the display device 100 to each other. The adhesive layer ADH may be formed using an optically transparent display adhesive such as pressure-sensitive adhesive, optical clear adhesive (OCA), optical clear resin (OCR), or the like, but is not limited thereto.

The cover glass 160 may protect the components of the display device 100 against external impacts and suppress damage such as scratches.

Figure 3A:
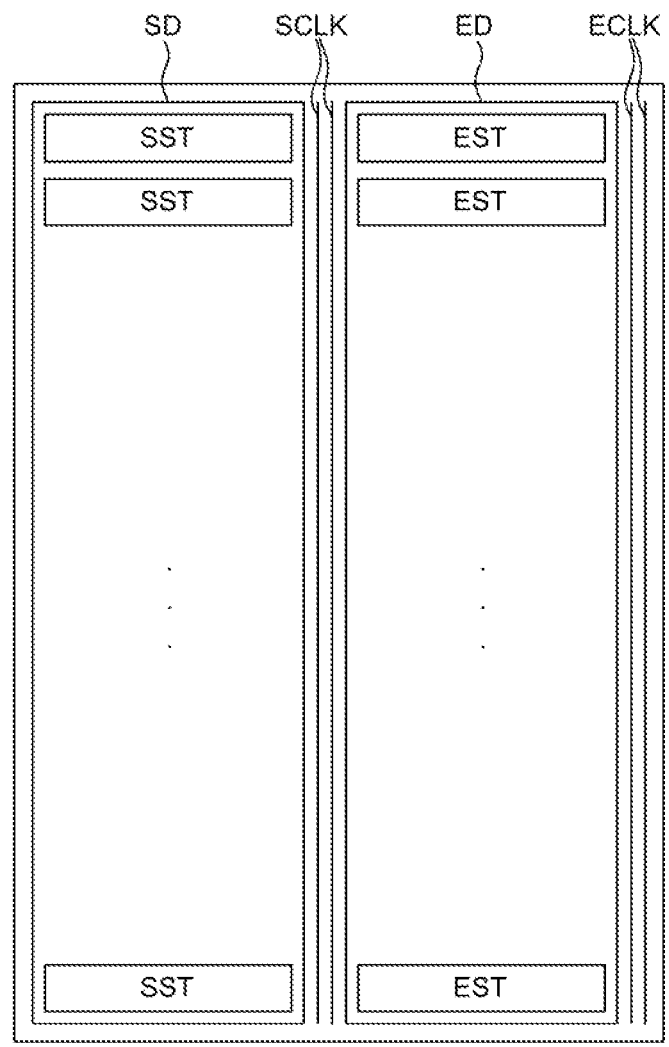
FIG. 3A is a schematic diagram of a gate driving unit of the display device according to some aspects of the present disclosure.

FIG. 3A is a schematic diagram of a gate driving unit of the display device according to some aspects of the present disclosure.

Referring to FIG. 3A, the gate driving unit 30 may include a scan driver SD, an emission driver ED and a plurality of clock lines SCLK and ECLK. Herein, the scan driver SD and the emission driver ED may include a plurality of scan stages SST and a plurality of emission stages EST, respectively.

First, the scan driver SD may output a scan signal to a plurality of scan lines, which is one non-limiting type of gate lines. The scan driver SD may receive various clock signals, a gate high voltage and a gate low voltage from a plurality of scan clock lines SCLK and output a scan signal. The scan driver SD may include a plurality of scan stages SST, and the plurality of scan stages SST may output a scan signal.

The emission driver ED is disposed on an outer side of the display panel 50 than the scan driver SD. The emission driver ED may output an emission signal to a plurality of emission lines, which is one kind of gate lines. The emission driver ED may receive various clock signals, a gate high voltage and a gate low voltage from a plurality of emission clock lines ECLK and output an emission signal. The emission driver ED may include a plurality of emission stages EST, and the plurality of emission stages EST may output an emission signal.

The plurality of clock lines SCLK and ECLK may include a scan clock line SCLK disposed between the scan driver SD and the emission driver ED and an emission clock line ECLK disposed between the emission driver ED and edge of the substrate 110. Although FIG. 3A illustrates only the scan clock line SCLK and the emission clock line ECLK, the present disclosure is not limited thereto. A start pulse line, a gate high voltage line, a gate low voltage line and the like for driving the scan driver SD and the emission driver ED may be further disposed.

Hereinafter, the plurality of scan stages SST included in the scan driver SD and the plurality of emission stages EST included in the emission driver ED will be described in more detail with reference to FIG. 3B and FIG. 3C.

Figure 3B:
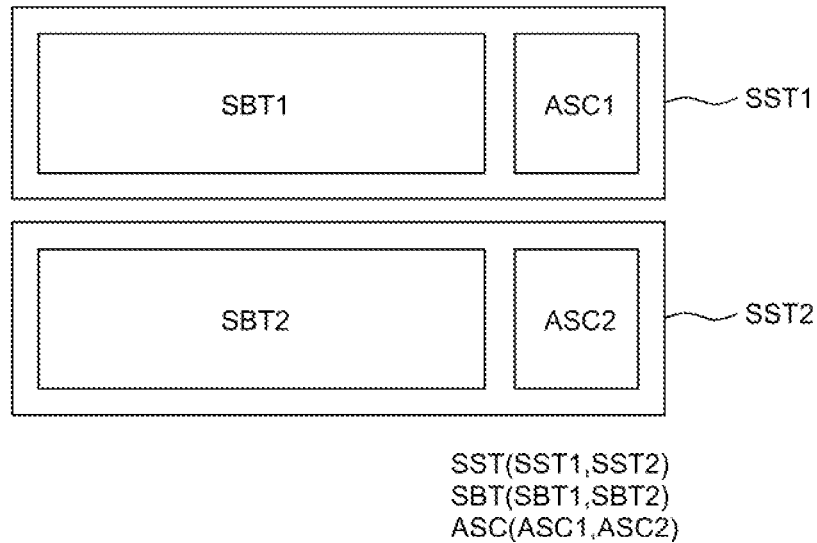
FIG. 3B is a schematic diagram of a plurality of scan stages in a scan driver of the gate driving unit of the display device according to some aspects of the present disclosure.
Figure 3C:
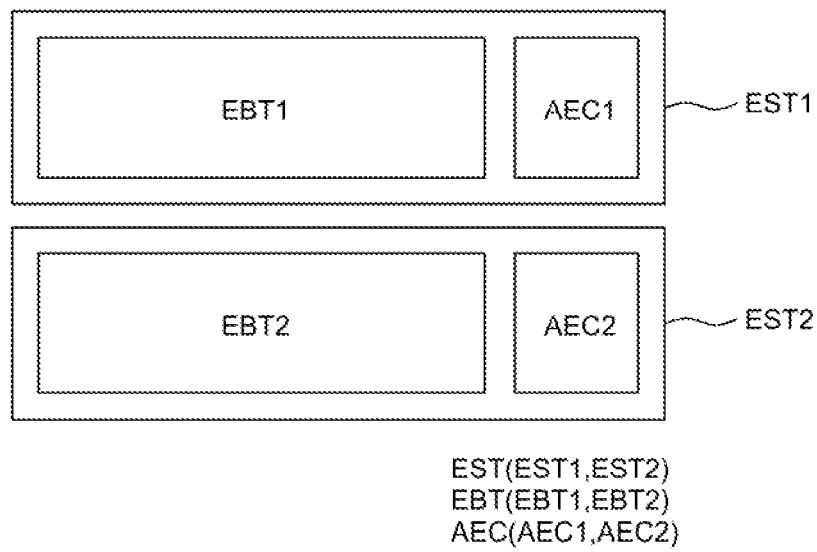
FIG. 3C is a schematic diagram of a plurality of emission stages in an emission driver of the gate driving unit of the display device according to some aspects of the present disclosure.

FIG. 3B is a schematic diagram of a plurality of scan stages in a scan driver of the gate driving unit of the display device according to some aspects of the present disclosure. FIG. 3C is a schematic diagram of a plurality of emission stages in an emission driver of the gate driving unit of the display device according to some aspects of the present disclosure.

First, the plurality of scan stages SST may include a scan circuit for outputting a scan signal. The scan circuit may be composed of various transistors, or may be composed of various transistors and capacitors. In this case, the scan circuit may include a scan buffer transistor SBT and an additional scan circuit ASC other than the scan buffer transistor SBT. That is, the components of the scan circuit except the scan buffer transistor SBT may be defined as the additional scan circuit ASC. In this case, the scan buffer transistor SBT may be a transistor having the largest planar size among all the transistors included in the scan circuit. A scan signal may be output from an output terminal of the scan buffer transistor SBT. In this case, the scan buffer transistor SBT includes a first scan buffer transistor SBT1, which is a normal output scan buffer transistor, disposed on a first scan stage SST1, which is a normal output scan stage, and configured to normally output a signal. Also, the scan buffer transistor SBT includes a second scan buffer transistor SBT2, which is a dummy output scan buffer transistor, disposed on a second scan stage SST2, which is a dummy output scan stage, and configured to abnormally output a signal. Further, the additional scan circuit ASC includes a first additional scan circuit ASC1 disposed on the first scan stage SST1 and a second additional scan circuit ASC2 disposed on the second scan stage SST2.

The plurality of scan stages SST includes a plurality of first scan stages SST1 and a plurality of second scan stages SST2. FIG. 3B illustrates only one of the plurality of first scan stages SST1 and one of the plurality of second scan stages SST2.

The plurality of first scan stages SST1 may be normal output scan stages configured to normally output a scan signal. The plurality of second scan stages SST2 may be dummy scan stages configured to not output a scan signal. The first scan stage SST1 may include the first scan buffer transistor SBT1 and the first additional scan circuit ASC1. The second scan stage SST2 may include the second scan buffer transistor SBT2 and the second additional scan circuit ASC2. In this case, the first additional scan circuit ASC1 may be identical to the second additional scan circuit ASC2. Also, the first scan buffer transistor SBT1 may be identical to the second scan buffer transistor SBT2. However, the second scan buffer transistor SBT2 disposed on the second scan stage SST2, which is a dummy scan stage, may not output a scan signal.

Then, the plurality of emission stages EST may include an emission circuit for outputting an emission signal. The emission circuit may be composed of various transistors, or may be composed of various transistors and capacitors. In this case, the emission circuit may include an emission buffer transistor EBT and an additional emission circuit AEC other than the emission buffer transistor EBT. That is, the components of the emission circuit except the emission buffer transistor EBT may be defined as the additional emission circuit AEC. In this case, the emission buffer transistor EBT may be a transistor having the largest planar size among all the transistors included in the emission circuit. An emission signal may be output from an output terminal of the emission buffer transistor EBT. In this case, the emission buffer transistor EBT includes a first emission buffer transistor EBT1, which is a normal output emission buffer transistor, disposed on a first emission stage EST1, which is a normal output emission stage, and configured to normally output a signal. Also, the emission buffer transistor EBT includes a second emission buffer transistor EBT2, which is a dummy output emission buffer transistor, disposed on a second emission stage EST2, which is a dummy output emission stage, and configured to not output a signal. Further, the additional emission circuit AEC includes a first additional emission circuit AEC1 disposed on the first emission stage EST1 and a second additional emission circuit AEC2 disposed on the second emission stage EST2.

The plurality of emission stages EST includes a plurality of first emission stages EST1 and a plurality of second emission stages EST2. FIG. 3C illustrates only one of the plurality of first emission stages EST1 and one of the plurality of second emission stages EST2.

The plurality of first emission stages EST1 may be normal output emission stages configured to normally output an emission signal. The plurality of second emission stages EST2 may be dummy emission stages configured to not output an emission signal. The first emission stage EST1 may include the first emission buffer transistor EBT1 and the first additional emission circuit AEC1. The second emission stage EST2 may include the second emission buffer transistor EBT2 and the second additional emission circuit AEC2. In this case, the first additional emission circuit AEC1 may be identical to the second additional emission circuit AEC2. Also, the first emission buffer transistor EBT1 may be identical to the second emission buffer transistor EBT2. However, the second emission buffer transistor EBT2 disposed on the second emission stage EST2, which is a dummy scan stage, may not output an emission signal.

Figure 4:
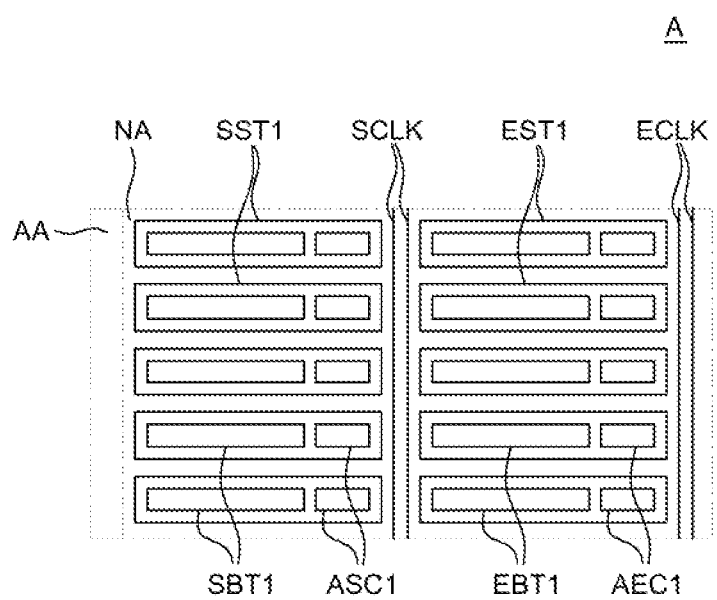
FIG. 4 is a schematic enlarged view of a portion A illustrated in FIG. 1 according to some aspects of the present disclosure.
Figure 5:
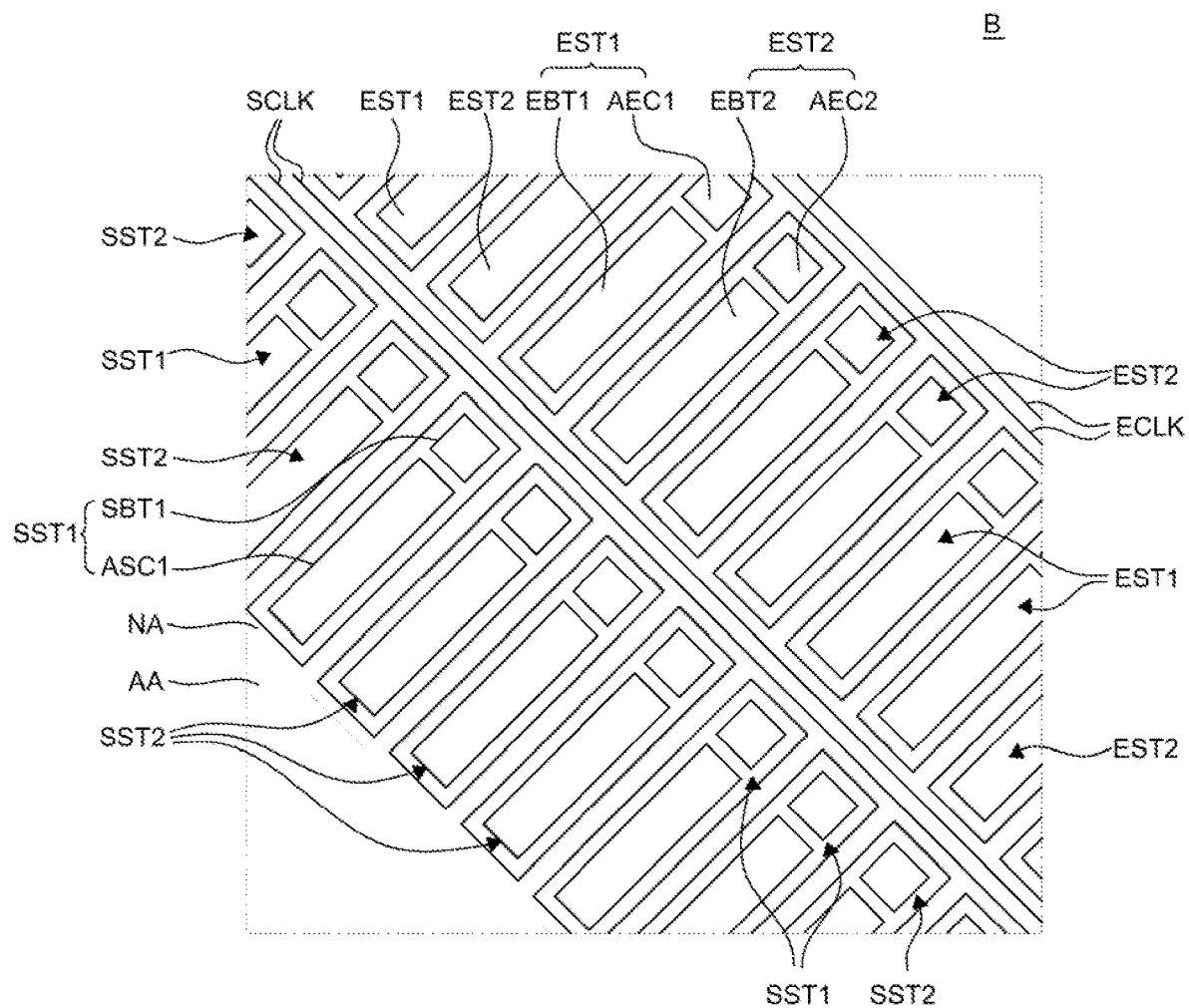
FIG. 5 is a schematic enlarged view of a portion B illustrated in FIG. 1 according to some aspects of the present disclosure.

FIG. 4 is a schematic enlarged view of a portion A illustrated in FIG. 1 according to some aspects of the present disclosure. FIG. 5 is a schematic enlarged view of a portion B illustrated in FIG. 1 according to some aspects of the present disclosure. Specifically, FIG. 4 is a schematic diagram illustrating the non-display area NA disposed on the right side of the display area AA of the display device 100. FIG. 4 illustrates only the components of the gate driving unit 30 among various components of the display device 100. Meanwhile, FIG. 4 illustrates the non-display area NA disposed on the right side of the display area AA. However, the non-display area NA disposed on the left side of the display area AA is bilaterally symmetrically disposed, and, thus, the techniques described herein can also be applied thereto. Also, FIG. 5 illustrates a portion of a right upper corner area among a plurality of corner areas of the display area AA, but the techniques described herein can also be applied to the other corner areas.

Referring to FIG. 4, the boundary between the display area AA and the non-display area NA disposed on the right side of the display area AA may be linear. Herein, an area on the right of the display area AA excludes a corner area. Therefore, the boundary between the display area AA and the non-display area NA disposed on the right side of the display area AA may be linear.

Referring to FIG. 4, the plurality of first scan stages SST1 among the plurality of scan stages SST, the plurality of scan clock lines SCLK, the plurality of first emission stages EST1 among the plurality of emission stages EST and the plurality of emission clock lines ECLK may be disposed in the non-display area NA disposed on the right side of the display area AA. That is, only the normal output stages including the plurality of first scan stages SST1 as normal output scan stages that normally output a scan signal and the plurality of first emission stages EST1 as normal output emission stages that normally output an emission signal are disposed in the non-display area NA disposed on the right side of the display area AA. However, the dummy stages including the second scan stage SST2 as a dummy scan stage that does not normally output a scan signal and the second emission stage EST2 as a dummy emission stage that does not normally output an emission signal are not disposed in the non-display area NA disposed on the right side of the display area AA. This is to optimize a layout design and to output a scan signal and an emission signal as needed from a minimum space.

Referring to FIG. 5, the boundary between the display area AA and the non-display area NA corresponding to the corner area of the display area AA may be curved. Thus, based on the same vertical width, the boundary between the display area AA and the non-display area NA corresponding to the corner area of the display area AA may have a greater length than the boundary between the display area AA and the non-display area NA disposed on the right side of the display area AA. Therefore, based on the same vertical width, the number of scan stages SST and emission stages EST disposed in the non-display area NA corresponding to the corner area of the display area AA may be greater than the number of scan stages SST and emission stages EST disposed in the non-display area NA disposed on the right side of the display area AA.

In this case, based on the same vertical width, the number of scan signals and emission signals output from the gate driving unit 30 corresponding to the corner area of the display area AA may be equal to the number of scan signals and emission signals output from the gate driving unit 30 disposed in the non-display area NA disposed on the right side of the display area AA. Therefore, based on the same vertical width, the number of first scan stages SST1, which are normal output scan stages, and first emission stages EST1, which are normal output emission stages, corresponding to the corner area of the display area AA may be equal to the number of first scan stages SST1 and first emission stages EST1 disposed in the non-display area NA disposed on the right side of the display area AA. However, based on the same vertical width, the number of scan stages SST and emission stages EST disposed in the non-display area NA corresponding to the corner area of the display area AA may be greater than the number of scan stages SST and emission stages EST disposed in the non-display area NA disposed on the right side of the display area AA. Therefore, the second scan stage SST2 as a dummy scan stage and the second emission stage EST2 as a dummy emission stage may be further disposed in the non-display area NA corresponding to the corner area of the display area AA.

Referring to FIG. 5, the plurality of first scan stages SST1, the plurality of second scan stages SST2, the plurality of scan clock lines SCLK, the plurality of first emission stages EST1, the plurality of second emission stages EST2 and the plurality of emission clock lines ECLK may be disposed in the non-display area NA corresponding to the corner area of the display area AA. That is, the normal output stages including the plurality of first scan stages SST1 as normal output scan stages that normally output a scan signal and the plurality of first emission stages EST1 as normal output emission stages that normally output an emission signal are disposed in the non-display area NA corresponding to the corner area of the display area AA. Also, the dummy stages including the plurality of second scan stages SST2 as dummy scan stages that do not normally output a scan signal and the plurality of second emission stages EST2 as dummy emission stages that do not normally output an emission signal are disposed in the non-display area NA corresponding to the corner area of the display area AA. The plurality of normal output stages is disposed in the non-display area NA corresponding to the corner area of the display area AA and the plurality of dummy stages having the same circuit structure is also disposed in a remaining space. This is to enable signal transmission in the scan driver SD and the emission driver ED and to facilitate a manufacturing process.

The plurality of first scan stages SST1 and the plurality of second scan stages SST2 may be disposed in an irregular order in the non-display area NA corresponding to the corner area of the display area AA. That is, the number and locations of the plurality of second scan stages SST2 further disposed in addition to the plurality of first scan stages SST1 may be determined based on a curvature of the boundary between the display area AA and the non-display area NA corresponding to the corner area of the display area AA. Therefore, as shown in FIG. 5, the plurality of first scan stages SST1 and the plurality of second scan stages SST2 may be disposed in an irregular order. However, the present disclosure is not limited thereto. The plurality of first scan stages SST1 and the plurality of second scan stages SST2 may also be disposed in a regular order.

Hereinafter, an operation of a plurality of normal output stages will be described with reference to a circuit diagram of a normal output stage and a waveform diagram for explaining an operation thereof.

Figure 6:
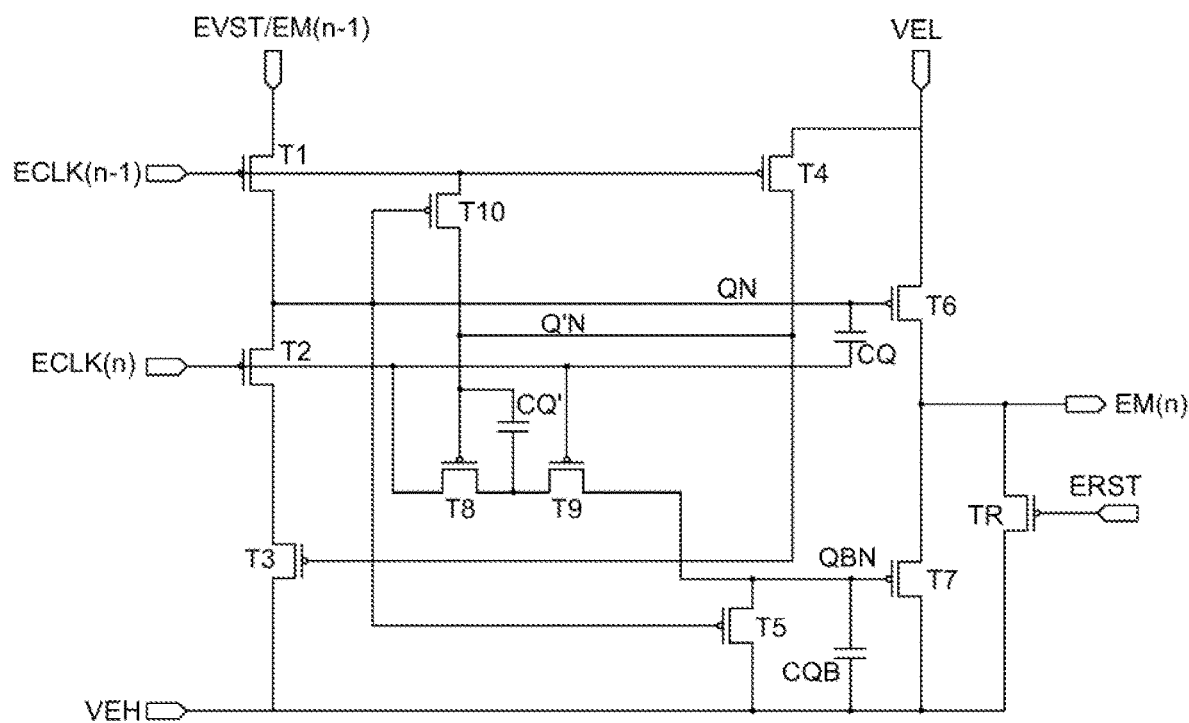
FIG. 6 is a circuit diagram showing an nth normal output stage according to some aspects of the present disclosure.
Figure 7:
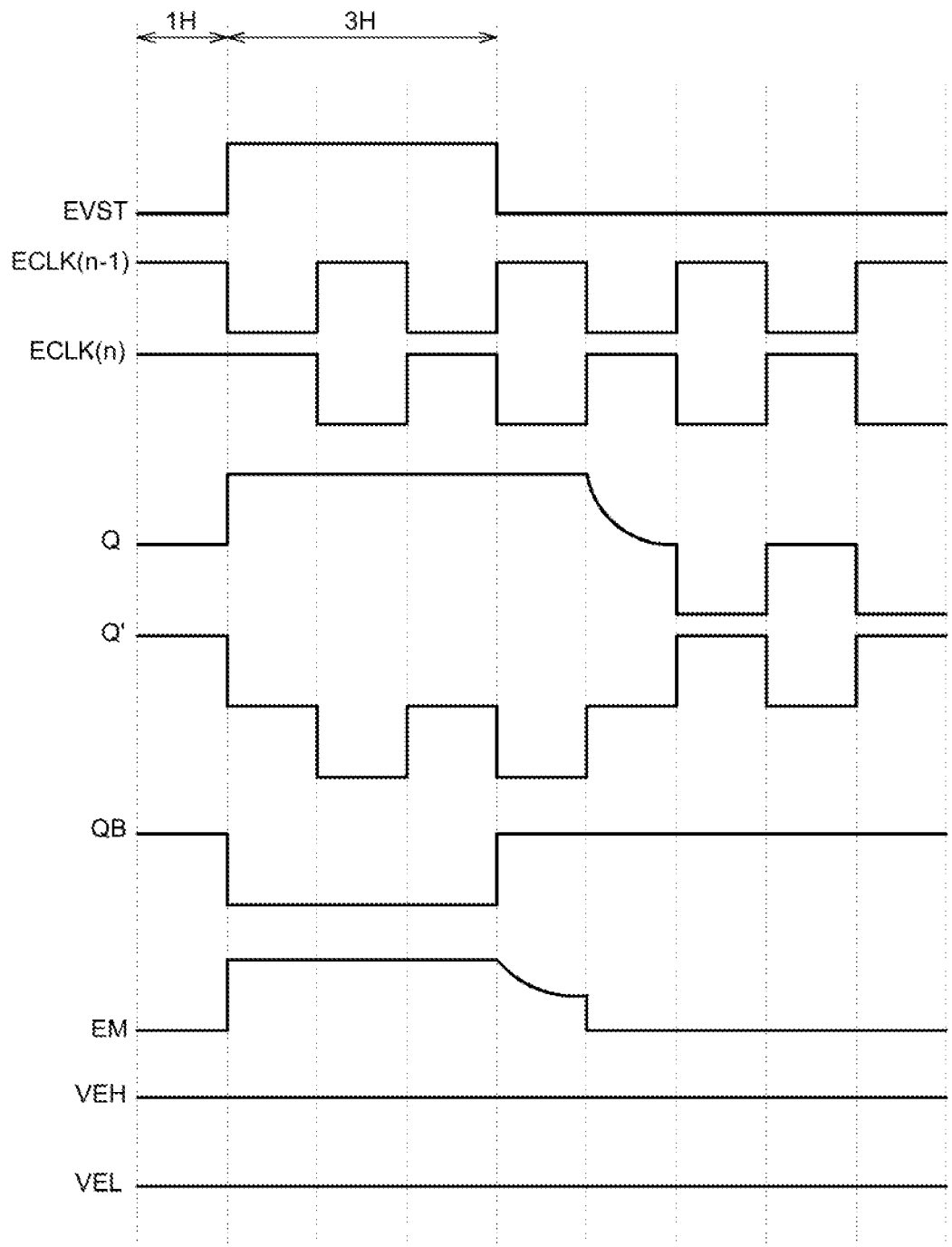
FIG. 7 is a waveform diagram for explaining an operation of a normal output stage according to some aspects of the present disclosure.

FIG. 6 is a circuit diagram showing an nth normal output stage according to some aspects of the present disclosure. FIG. 7 is a waveform diagram for explaining an operation of a normal output stage according to some aspects of the present disclosure. Specifically, FIG. 6 is a circuit diagram of a first emission stage EST1 as a normal output emission stage that normally outputs an emission signal in the gate driving unit 30 of the display device 100 according to some aspects of the present disclosure.

Referring to FIG. 6, an nth normal output emission stage according to an exemplary embodiment of the present disclosure may include a first transistor T1 to a tenth transistor T10, first to third capacitors CQ, CQB and CQ' and a reset transistor TR.

The sixth transistor T6 and the seventh transistor T7 among the first to tenth transistors T1 to T10 may be included in an output unit that outputs an emission control signal.

The first to fifth transistors T1 to T5 and the eighth to tenth transistors T8 to T10 may be included in a node controller.

Hereinafter, for the convenience of description, the first to tenth transistors T1 to T10 and the reset transistor TR will be described as p-type thin film transistors, but are not limited thereto.

The first to tenth transistors T1 to T10 and the reset transistor TR implemented as p-type thin film transistors are turned on under the condition that a low voltage VEL is applied thereto. Also, they are tuned off under the condition that a high voltage VEH is applied thereto.

The first transistor T1 has a gate electrode connected to a second clock signal line ECLK[n−1], a first electrode connected to a start signal line EVST or an output terminal EM[n−1] of a previous stage, and a second electrode connected to a Q-node QN. The first transistor T1 is turned on or off depending on a second clock signal applied through the second clock signal line ECLK[n−1].

The second transistor T2 has a gate electrode connected to a first clock signal line ECLK[n], a first electrode connected to the Q-node QN, and a second electrode connected to a first electrode of the third transistor T3. The second transistor T2 is turned on or off depending on a first clock signal applied through the first clock signal line ECLK[n].

The third transistor T3 has a gate electrode connected to a second electrode of the fourth transistor T4, the first electrode connected to the second electrode of the second transistor T2, and a second electrode connected to a first voltage line VEH. When the fourth transistor T4 is turned on, the third transistor T3 is turned on depending on a second voltage applied through a second voltage line VEL.

The fourth transistor T4 has a gate electrode connected to the second clock signal line ECLK[n−1], a first electrode connected to the second voltage line VEL, and the second electrode connected to the gate electrode of the third transistor T3. The fourth transistor T4 is turned on or off depending on the second clock signal applied through the second clock signal line ECLK[n−1]. Therefore, the fourth transistor T4 is turned on or off at the same time as the first transistor T1.

The fifth transistor T5 has a gate electrode connected to the Q-node QN, a first electrode connected to a QB-node QBN, and a second electrode connected to the first voltage line VEH. The fifth transistor T5 is turned on or off depending on a potential of the Q-node QN.

The sixth transistor T6 has a gate electrode connected to the Q-node QN and one end of the first capacitor CQ, a first electrode connected to the second voltage line VEL, and a second electrode connected to an output terminal EM[n] of the nth normal output emission stage. The sixth transistor T6 is turned on or off depending on a potential of the Q-node QN.

The seventh transistor T7 has a gate electrode connected to the QB-node QBN, a first electrode connected to the output terminal EM[n] of the nth normal output emission stage, and a second electrode connected to the first voltage line VEH. The seventh transistor T7 is turned on or off depending on a potential of the QB-node QBN.

The eighth transistor T8 has a gate electrode connected to a Q'-node Q'N, a first electrode connected to the first clock signal line ECLK[n], and a second electrode connected to a first electrode of the ninth transistor T9. The eighth transistor T8 is turned on or off depending on a potential of the Q'-node Q'N.

The ninth transistor T9 has a gate electrode connected to the first clock signal line ECLK[n], the first electrode connected to the second electrode of the eighth transistor T8, and a second electrode connected to the QB-node QBN. The ninth transistor T9 is turned on or off depending on a potential of the eighth transistor T8.

The tenth transistor T10 has a gate electrode connected to the Q-node QN, a first electrode connected to the second clock signal line ECLK[n−1], and a second electrode connected to the Q'-node Q'N. The tenth transistor T10 is turned on or off depending on a potential of the Q-node QN.

The first capacitor CQ has one end connected to the Q-node QN and the other end connected to the first clock signal line ECLK[n]. The second capacitor CQB is connected between the QB-node QBN and the first voltage line VEH. The third capacitor CQ' connects the Q'-node Q'N and between the second electrode of the eighth transistor T8 and the gate electrode of the ninth transistor T9.

The reset transistor TR has a gate electrode connected to a reset signal line ERST, a first electrode connected to the output terminal EM[n] of the nth normal output emission stage, and a second electrode connected to the first voltage line VEH. The reset transistor TR is turned on or off depending on a reset signal applied through the reset signal line ERST. When the reset transistor TR is turned on, the output terminal EM[n] of the nth normal output emission stage outputs an emission signal of a high voltage based on a first voltage applied through the first voltage line VEH.

FIG. 7 is a waveform diagram for explaining an operation of the nth normal output emission stage, according to some aspects of the present disclosure.

Referring to FIG. 7, a start signal EVST applied through the start signal line EVST may have a high voltage for three horizontal periods 3H. A second clock signal ECLK[n−1] applied through the second clock signal line ECLK[n−1] may alternately have a low voltage and a high voltage at a cycle of one horizontal period 1H in synchronization with a timing (rising edge) of the high voltage of the start signal EVST. A first clock signal ECLK[n] applied through the first clock signal line ECLK[n] may alternately have a high voltage and a low voltage at a cycle of one horizontal period 1H in synchronization with a timing (rising edge) of the high voltage of the start signal EVST. That is, the second clock signal ECLK[n−1] and the first clock signal ECLK[n] may have a high voltage and a low voltage in opposite phases to each other.

The components included in the nth normal output emission stage operate according to the start signal EVST, the first clock signal ECLK[n], the second clock signal ECLK[n−1], the first voltage VEH and the second voltage VEL.

When the components included in the nth normal output emission stage operate, the Q-node QN has a period in which it is charged to a high voltage and the Q'-node Q'N and the QB-node QBN have a period in which they are discharged to a low voltage. In this case, the QB-node QBN may maintain a low voltage having a reverse phase delayed by one horizontal period 1H compared to the start signal EVST for three horizontal periods 3H.

That is, during a low voltage period of the second clock signal ECLK[n−1], the first transistor T1 and the fourth transistor T4 are turned on. Thus, the first transistor T1 and the fourth transistor T4 apply the start signal EVST, which has a high voltage for horizontal periods 3H, to the Q-node QN and the second voltage VEH to the gate electrode of the third transistor T3 and the Q'-node Q'N. In this case, the tenth transistor T10 and the fifth transistor T5 are turned off and the eighth transistor T8 is turned on.

Then, when the second clock signal ECLK[n−1] transitions to a high voltage period and the first clock signal ECLK[n] transitions to a low voltage period, the first transistor T1 and the fourth transistor T4 are turned off. Also, the second transistor T2 and the ninth transistor T9 are turned on to apply a low voltage of the first clock signal ECLK[n] to the QB-node QBN. Therefore, the seventh transistor T7 is turned on to output the first voltage VEH to the output terminal EM[n] of the nth normal output emission stage.

After the start signal EVST transitions to a low voltage, the second clock signal ECLK[n−1] transitions again to a low voltage and the first clock signal ECLK[n] transitions again to a high voltage period. At that time, the Q-node QN is discharged to the low voltage and the QB-node QB is charged to a first voltage. Also, the output terminal EM[n] of the nth normal output emission stage outputs a signal of a second voltage.

The sixth transistor T6 included in the emission control signal output unit of the nth normal output emission stage is turned on or off depending on a potential of the Q-node QN. Also, the seventh transistor T7 included in the emission control signal output unit of the nth normal output emission stage is turned on or off depending on a potential of the QB-node QBN. When the Q-node QN has a potential of a high voltage, the QB-node QBN may maintain a potential of a low voltage.

Since the seventh transistor T7 is turned on by the low voltage of the QB-node QBN, the first voltage VEH applied through the first voltage line VEH is output through the output terminal EM[n] of the nth normal output emission stage. As a result, the output terminal EM[n] of the nth normal output emission stage outputs an emission control signal Em[n] of a high voltage for at least three horizontal periods 3H based on the first voltage VEH applied through the first voltage line VEH and then converts to the emission control signal Em[n] of a low voltage.

Figure 8:
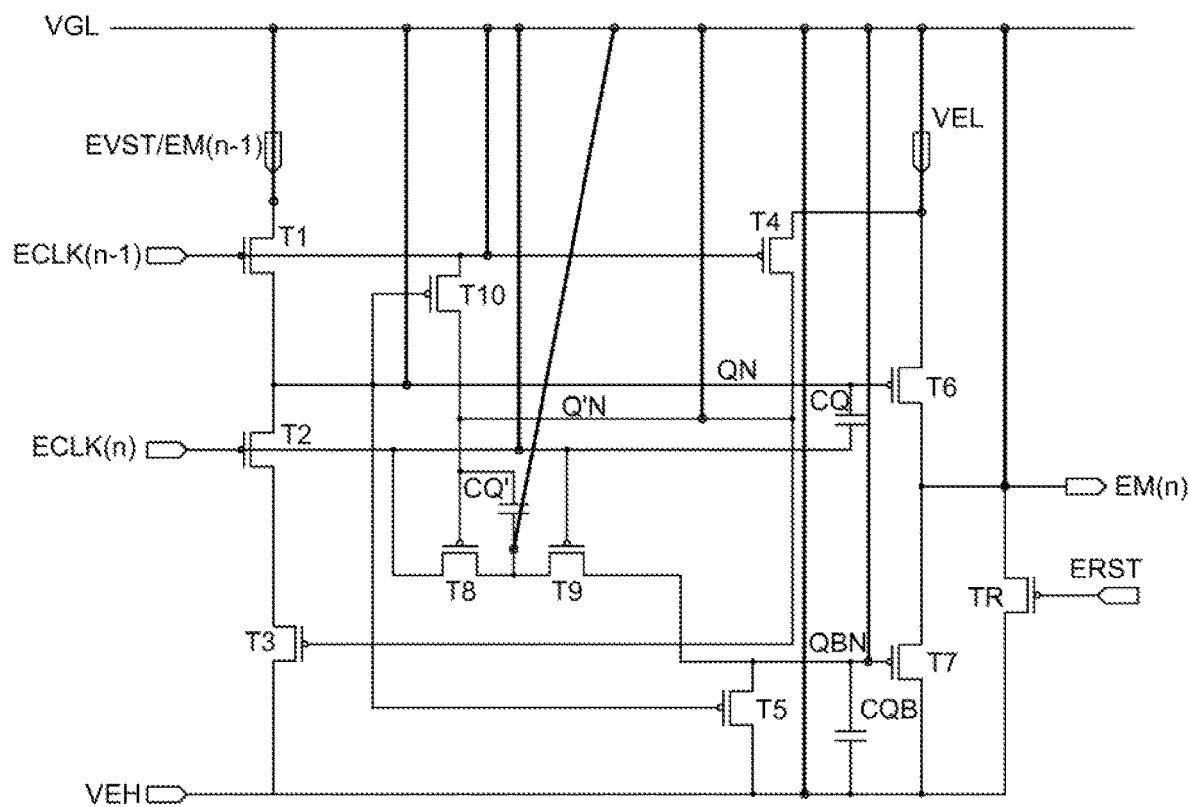
FIG. 8 is a circuit diagram showing an nth dummy stage according to some aspects of the present disclosure.

FIG. 8 is a circuit diagram showing an nth dummy stage according to some aspects of the present disclosure.

Conventionally, when a circuit of a dummy stage is configured, the dummy stage has the same circuit as a normal output stage. However, all nodes of each circuit are allowed to float or connected to a gate high voltage (VGH) line.

Meanwhile, in the display device 100, minus (−) charges are generated due to scrubbing or friction on the surface. When the minus (−) charges are accumulated, an area occupied by the minus (−) charges may increase. If all nodes of a circuit unit of the dummy stage are allowed to float or connected to the VGH line as in the conventional case, an attractive force of the VGH line causes the introduction of the minus (−) charges accumulated in the surface of the display device 100 into the normal output stage as well as the dummy stage in the gate driving unit 30. Therefore, the minus (−) charges introduced into the normal output stage may cause a scan stage in the gate driving unit 30 to generate and output an abnormal display.

According to an exemplary embodiment of the present disclosure, the dummy stage has the same circuit as the normal output stage. However, when the circuit of the dummy stage is configured, all nodes of each circuit are connected to a gate low voltage VGL line. Therefore, a repulsive force of the gate low voltage VGL line blocks the introduction of the minus (−) charges accumulated in the surface of the display device 100 into the gate driving unit 30. Thus, it is possible to suppress an abnormal output of the display device 100.

As shown in FIG. 8, in the circuit of the dummy stage, the gate low voltage VGL line may be connected to the QB-node QBN and the Q-node QN. The gate low voltage VGL line may be connected between the output unit including the sixth transistor T6 and the seventh transistor T7 and the QB-node QBN, or between the output unit including the sixth transistor T6 and the seventh transistor T7 and the Q-node QN.

Also, in the circuit of the dummy stage, the gate low voltage VGL line may be connected between the start signal EVST or the emission control signal EM[n−1] output from a previous stage, the first clock signal ECLK[n] or the second clock signal ECLK[n−1] and the node controller including the first to fifth transistors T1 to T5 and the eighth to tenth transistors T8 to T10.

Accordingly, all the nodes in the circuit of the dummy stage are connected to the gate low voltage VGL line. Also, a repulsive force of the gate low voltage VGL line blocks the introduction of the minus (−) charges accumulated in the surface of the display device 100 into the gate driving unit 30. Thus, it is possible to suppress an abnormal output of the display device 100.

The exemplary embodiments of the present disclosure can also be described as follows:

According to an aspect of the present disclosure, a display device, comprising: a substrate including a display area and a non-display area enclosing the display area; a plurality of pixels disposed in the display area; and a gate driving unit disposed in the non-display area on both sides of the display area and including a plurality of stages, wherein the plurality of stages includes a plurality of normal output stages and a plurality of dummy stages. The plurality of dummy stages not outputting a signal. The plurality of dummy stages is connected to a gate low voltage line.

The substrate has a plurality of round corner areas, and the plurality of dummy stages may be disposed in the non-display area corresponding to the plurality of round corner areas.

The gate driving unit includes a scan driver and an emission driver disposed on an outer side of the substrate than the scan driver, the plurality of stages includes a plurality of scan stages included in the scan driver and a plurality of emission stages included in the emission driver, and the plurality of dummy stages may include a plurality of dummy scan stages and a plurality of dummy emission stages.

Each of the plurality of stages may include an output unit configured to output a first voltage as an emission control signal based on a potential of a QB-node and a second voltage as the emission control signal based on a potential of a Q-node; and a node controller configured to operate based on a start signal or an emission control signal output from a previous stage, a first clock signal and a second clock signal to control potentials of the QB-node and the Q-node.

The output unit may include a first transistor having a gate electrode connected to the Q-node, a first electrode connected to a second voltage supply line for supplying the second voltage, and a second electrode connected to an output terminal; and a second transistor having a gate electrode connected to the QB-node, a first electrode connected to the output terminal, and a second electrode connected to a first voltage supply line for supplying the first voltage.

The node controller may include a first transistor having a gate electrode connected to a second clock signal supply line for supplying the second clock signal, a first electrode connected to a start signal line for supplying the start signal or an output terminal of a previous stage, and a second electrode connected to the Q-node; a second transistor having a gate electrode connected to a first clock signal line for supplying the first clock signal and a first electrode connected to the Q-node; a third transistor having a first electrode connected to the second electrode of the second transistor and a second electrode connected to a first voltage supply line for supplying the first voltage; a fourth transistor having a gate electrode connected to the second clock signal supply line, a first electrode connected to a second voltage supply line for supplying the second voltage, and a second electrode connected to the gate electrode of the third transistor; a fifth transistor having a gate electrode connected to the Q-node, a first electrode connected to the QB-node, and a second electrode connected to the first voltage supply line; a sixth transistor having a gate electrode connected to the second electrode of the fourth transistor and a first electrode connected to the first clock signal supply line; a seventh transistor having as a gate electrode connected to the first clock signal supply line, a first electrode connected to the second electrode of the sixth transistor, and a second electrode connected to the QB-node; and an eighth transistor having a gate electrode connected to the Q-node and a first electrode connected to the second clock signal supply line.

The node controller may further include a first capacitor connected between the Q-node and the first clock signal supply line; a second capacitor connected between the QB-node and the first voltage supply line; and a third capacitor connected between the gate electrode of the eighth transistor and the second electrode of the eighth transistor.

The display device may further comprise a reset transistor that is controlled by a reset signal to reset an output terminal of the output unit to the first voltage.

In the plurality of dummy stages, each of the QB-node and the Q-node may be connected to the gate low voltage line.

In the plurality of dummy stages, the gate low voltage line may be connected between the output unit and the QB-node, or between the output unit and the Q-node.

In the plurality of dummy stages, the gate low voltage line may be connected between the start signal or the emission control signal output from the previous stage, the first clock signal or the second clock signal and the node controller.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a substrate including a display area and a non-display area enclosing the display area;
    a plurality of pixels disposed in the display area; and
    a gate driving unit disposed in the non-display area on both sides of the display area and including a plurality of stages, wherein the plurality of stages includes a plurality of first stages and a plurality of second stages, the plurality of second stages not outputting a signal, and
    the plurality of second stages is connected to a gate low voltage line, wherein
    each of the plurality of stages includes a node controller having at least two signal sources to operate based on, the two signal sources including a start signal or an emission control signal,
    the node controller includes a plurality of transistors, and
    a capacitor connected between a gate electrode and a source electrode of one of the plurality of transistors of the node controller.

2. The display device according to claim 1, wherein the substrate has a plurality of round corner areas, and
    the plurality of second stages is disposed in the non-display area corresponding to the plurality of round corner areas.

3. The display device according to claim 1, wherein the gate driving unit includes a scan driver and an emission driver disposed on an outer side of the substrate than the scan driver.

4. The display device according to claim 1, wherein each of the plurality of stages further includes:
   an output unit configured to output a first voltage as the emission control signal based on a potential of a QB-node, and a second voltage as the emission control signal based on a potential of a Q-node; and
   the at least two signal sources based on which the node controller is configured to operate include a start signal or the emission control signal output from a previous stage, a first clock signal and a second clock signal to control potentials of the QB-node and the Q-node.

5. The display device according to claim 4, wherein the output unit comprises:
   a first transistor having a gate electrode connected to the Q-node, a first electrode connected to a second voltage supply line for supplying the second voltage, and a second electrode connected to an output terminal; and
   a second transistor having a gate electrode connected to the QB-node, a first electrode connected to the output terminal, and a second electrode connected to a first voltage supply line for supplying the first voltage.

6. The display device according to claim 4, wherein the plurality of transistors comprise:
   a first transistor having a gate electrode connected to a second clock signal supply line for supplying the second clock signal, a first electrode connected to a start signal line for supplying the start signal or an output terminal of a previous stage, and a second electrode connected to the Q-node;
   a second transistor having a gate electrode connected to a first clock signal line for supplying the first clock signal and a first electrode connected to the Q-node;
   a third transistor having a first electrode connected to the second electrode of the second transistor and a second electrode connected to a first voltage supply line for supplying the first voltage;
   a fourth transistor having a gate electrode connected to the second clock signal supply line, a first electrode connected to a second voltage supply line for supplying the second voltage, and a second electrode connected to the gate electrode of the third transistor;
   a fifth transistor having a gate electrode connected to the Q-node, a first electrode connected to the QB-node, and a second electrode connected to the first voltage supply line;
   a sixth transistor having a gate electrode connected to the second electrode of the fourth transistor and a first electrode connected to the first clock signal supply line;
   a seventh transistor having a gate electrode connected to the first clock signal supply line, a first electrode connected to the second electrode of the sixth transistor, and a second electrode connected to the QB-node; and
   an eighth transistor having a gate electrode connected to the Q-node and a first electrode connected to the second clock signal supply line.

7. The display device according to claim 6, wherein the node controller further comprises:
   a first capacitor connected between the Q-node and the first clock signal supply line;
   a second capacitor connected between the QB-node and the first voltage supply line; and
   a third capacitor connected between the gate electrode of the eighth transistor and the second electrode of the eighth transistor, the third capacitor being the capacitor and the eighth transistor being the one of the plurality of transistors.

8. The display device according to claim 4, further comprising:
   a reset transistor that is controlled by a reset signal to reset an output terminal of the output unit to the first voltage.

9. The display device according to claim 4, wherein in the plurality of second stages, each of the QB-node and the Q-node is connected to the gate low voltage line.

10. The display device according to claim 9, wherein in the plurality of second stages, the gate low voltage line is connected between the output unit and the QB-node, or between the output unit and the Q-node.

11. The display device according to claim 9, wherein in the plurality of second stages, the gate low voltage line is connected between the start signal or the emission control signal output from the previous stage, the first clock signal or the second clock signal and the node controller.

12. The display device according to claim 1, wherein the plurality of first stages includes a plurality of first scan stages and a plurality of first emission stages, and
   wherein the plurality of second stages includes a plurality of second scan stages and a plurality of second emission stages.

13. The display device according to claim 12, wherein the plurality of first scan stages are configured to output a scan signal and the plurality of second scan stages are configured to not output a scan signal.

14. The display device according to claim 12, wherein the plurality of first emission stages is configured to output an emission signal and a plurality of second emission stages is configured to not output an emission signal.

15. The display device according to claim 13, wherein each of the plurality of first scan stages includes a first scan buffer transistor, and each of the plurality of second scan stages includes a second scan buffer transistor configured to not output a scan signal.

16. The display device according to claim 14, wherein each of the plurality of first emission stages includes a first emission buffer transistor, and each of the plurality of second emission stages includes a second emission buffer transistor configured to not output an emission signal.

17. The display device according to claim 12, the plurality of first scan stages and the plurality of second scan stages are included in a scan driver and the plurality of first emission stages and the plurality of second emission stages are included in the emission driver.

18. A display device, comprising:
   a display area;
   a non-display area enclosing the display area;
   a gate driver in the non-display area that includes a plurality of first stages connected to a gate low voltage line, wherein
   each of the plurality of stages includes a node controller having at least two signal sources to operate based on, the two signal sources including a start signal or an emission control signal,
   the node controller includes a plurality of transistors, and
   a capacitor connected between a gate electrode and a source electrode of one of the plurality of transistors of the node controller.

19. The display device of claim 18, wherein the plurality of stages are configured to block a repulsive force of the gate low voltage line to suppress an abnormal output in the display area.

20. The display device of claim 18, wherein the gate driver includes a second plurality of stages not connected to the gate low voltage line and the plurality of second stages is disposed in the non-display area corresponding to a plurality of round corner areas.

* * * * *